(12) United States Patent
Ferguson et al.

(10) Patent No.: US 6,578,190 B2
(45) Date of Patent: Jun. 10, 2003

(54) PROCESS WINDOW BASED OPTICAL PROXIMITY CORRECTION OF LITHOGRAPHIC IMAGES

(75) Inventors: Richard A. Ferguson, Pleasant Valley, NY (US); Mark A. Lavin, Katonah, NY (US); Lars W. Liebmann, Poughquag, NY (US); Alfred K. Wong, Pokfulam (HK)

(73) Assignee: International Business Machines Corporation, Armonk, NY (US)

( * ) Notice: Subject to any disclaimer, the term of this patent is extended or adjusted under 35 U.S.C. 154(b) by 78 days.

(21) Appl. No.: 09/759,013

(22) Filed: Jan. 11, 2001

(65) Prior Publication Data

US 2002/0091986 A1 Jul. 11, 2002

(51) Int. Cl.⁷ .................. G06F 17/50; G06F 19/00; G21K 5/00; G03F 9/02; G06K 9/74
(52) U.S. Cl. .............. 716/21; 716/5; 700/121; 700/120; 700/110; 430/5; 378/35; 382/144
(58) Field of Search ............. 716/1–21; 700/96–110, 700/117–121; 430/4–5; 378/34–35; 382/144

(56) References Cited

U.S. PATENT DOCUMENTS

| | | | |
|---|---|---|---|
| 5,340,700 A | | 8/1994 | Chen et al. ............. 430/312 |
| 5,723,233 A | | 3/1998 | Garza et al. ............. 430/5 |
| 5,723,235 A | * | 3/1998 | Tsudaka et al. ............. 430/5 |
| 5,795,688 A | * | 8/1998 | Burdorf et al. ............. 430/30 |
| 5,801,954 A | * | 9/1998 | Le et al. ............. 716/21 |
| 5,889,686 A | * | 3/1999 | Mimotogi et al. ............. 716/19 |
| 5,965,306 A | * | 10/1999 | Mansfield et al. ............. 430/22 |
| 6,077,310 A | * | 6/2000 | Yamamoto et al. ............. 716/19 |
| 6,078,738 A | * | 6/2000 | Garza et al. ............. 716/21 |
| 6,081,658 A | | 6/2000 | Rieger et al. ............. 716/21 |
| 6,178,360 B1 | * | 1/2001 | Pierrat et al. ............. 700/121 |
| 6,249,597 B1 | * | 6/2001 | Tsudaka ............. 382/144 |
| 6,261,728 B1 | * | 7/2001 | Lin ............. 430/30 |
| 6,272,392 B1 | * | 8/2001 | Capodieci ............. 700/110 |
| 6,340,543 B1 | * | 1/2002 | Nagamura et al. ............. 430/5 |
| 6,345,210 B1 | * | 2/2002 | Yu ............. 700/121 |
| 6,388,736 B1 | * | 5/2002 | Smith et al. ............. 355/53 |
| 6,418,553 B1 | * | 7/2002 | Yamada et al. ............. 716/21 |
| 6,453,457 B1 | * | 9/2002 | Pierrat et al. ............. 716/19 |
| 6,470,489 B1 | * | 10/2002 | Chang et al. ............. 716/21 |
| 6,472,107 B1 | * | 10/2002 | Chan ............. 430/5 |
| 2002/0100004 A1 | * | 7/2002 | Pierrat et al. ............. 716/5 |

* cited by examiner

Primary Examiner—Matthew Smith
Assistant Examiner—Phallaka Kik
(74) Attorney, Agent, or Firm—DeLio & Peterson LLC; Peter W. Peterson; Tiffany L. Townsend

(57) ABSTRACT

A method of creating a pattern for a mask adapted for use in lithographic production of features on a substrate. The method comprises initially providing a mask pattern of a feature to be created on the substrate using the mask. The method then includes establishing target dimensional bounds of the pattern, determining simulated achievable dimensional bounds of the pattern, comparing the target dimensional bounds of the pattern to the simulated achievable dimensional bounds of the pattern, and determining locations where the simulated achievable dimensional bounds of the pattern differ from the target dimensional bounds of the pattern. In its preferred embodiment, the feature is an integrated circuit to be lithographically produced on a semiconductor substrate.

24 Claims, 5 Drawing Sheets

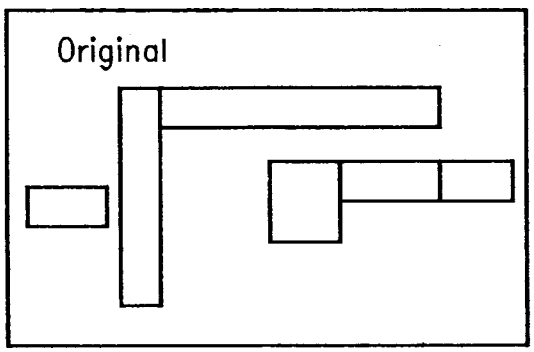
FIG. 1a
(Prior Art)
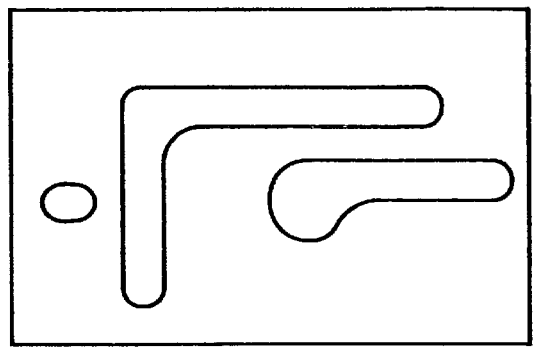
FIG. 1b
(Prior Art)
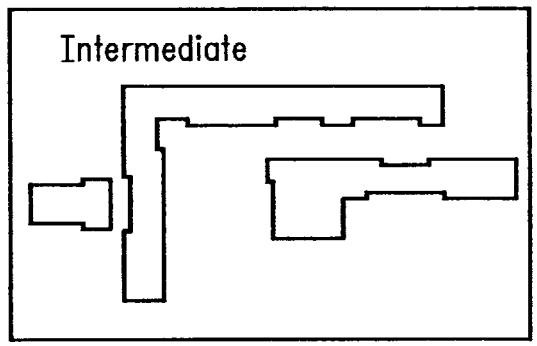
FIG. 1c
(Prior Art)
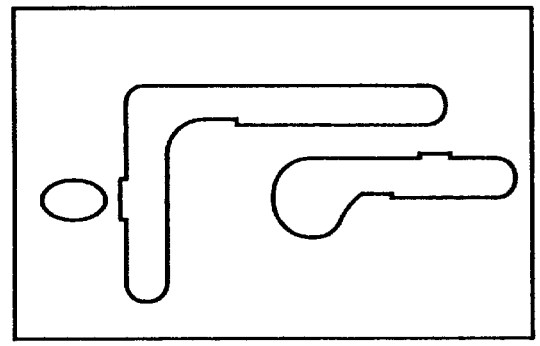
FIG. 1d
(Prior Art)
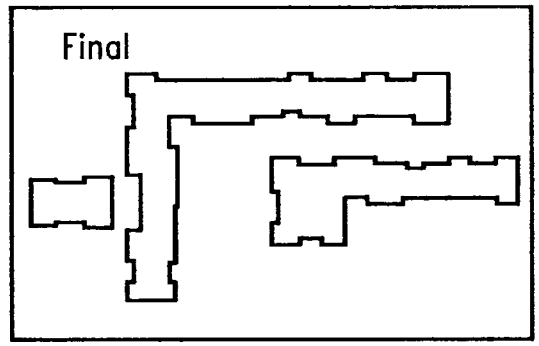
FIG. 1e
(Prior Art)
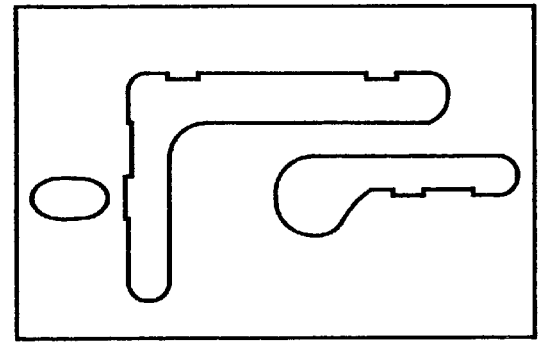
FIG. 1f
(Prior Art)

PROCESS WINDOW BASED OPTICAL PROXIMITY CORRECTION OF LITHOGRAPHIC IMAGES

BACKGROUND OF THE INVENTION

1. Field of the Invention

This invention relates to semiconductor fabrication and, in particular, to an improved method for creating a mask pattern of an integrated circuit (IC) for use in lithographic processing.

2. Description of Related Art

Integrated circuits are fabricated by lithographic techniques, where energy beams transmit integrated circuit images or patterns on photomasks to photosensitive resists on semiconductor wafer substrates. The circuit image on the photomask may not be reproduced precisely on the substrate, in part because of optical effects among transmitted and blocked energy passing through the photomask.

Optical Proximity Correction (OPC) has been employed as a key enabling resolution enhancement technique required to meet image size control requirements imposed by state-of-the-art integrated circuit product programs. OPC is essentially the deliberate and proactive distortion of photomask patterns to compensate for systematic and stable errors. OPC is generally categorized as either rules-based or model-based. Rules-based OPC is done by determining the correctable imaging errors, calculating appropriate photomask compensations, and finally applying the calculated corrections directly to the photomask layout. While proven to be very efficient at correcting some important one- and two-dimensional imaging problems, non-iterative rules-based OPC is generally believed limited in its usefulness due to the finite number of rules that are available to describe all layout situations, the difficulty of calculating exact correction values based on measured errors, and the lack of feedback loop during the correction process.

Existing model-based OPC tools overcome some of these shortcomings by employing an essentially trial-and-error iterative optimization approach. Model-based OPC is based on the concept of capturing the imaging characteristics in a mathematical model, or a combination of mathematics and heuristics, and calculating only the expected on-wafer circuit image which would be projected by the mask pattern under investigation. The correction to be applied is never directly calculated. Rather, the correction is derived by comparing the simulated image contour placement to the edge placement of the original mask pattern and iteratively adjusting until a match is found or until all iterations are exhausted.

For example, as shown in FIG. 1a, the actual circuit pattern to be reproduced on a substrate layer is created on a mask. An existing OPC tool then runs a simulation on these patterns and predicts the actual wafer pattern image after transmission onto the wafer substrate, taking into account optical proximity effects, as shown in FIG. 1b. The OPC tool then compares the wafer image FIG. 1b with the original circuit pattern FIG. 1a, determines the required adjustment of the mask pattern so that the mask and wafer images are in better agreement. After a first pass correction and movement of edges that do not agree, a new mask image is then created, FIG. 1c. The OPC tool again runs a simulation of the mask pattern image which will be created on the wafer substrate, and generates a new predicted wafer image, FIG. 1d. The process continues if necessary with a subsequent correction to create a new mask image, FIG. 1e, and another simulation of the pattern image created on the wafer, FIG. 1f. Typically the OPC process takes up to eight to ten, or more, iterations until a suitable mask image is created. By basing the correction on a layout independent model of the patterning process and iterating toward an optimized correction, model-based OPC overcomes many of the shortcomings of rules-based OPC outlined above.

The goal of any resolution enhancement technique (RET) ultimately should be to improve circuit performance or yield. In order to do so, RET has to ensure the layout patterns are replicated within the specifications assumed by the circuit designer over the largest possible process window (i.e., range of exposure dose and defocus). Although they have improved pattern replication on wafers, present rules-based and model-based OPC methods still present deficiencies in producing circuit pattern in that their goal is to improve accuracy of pattern replication at one point of the process window (i.e., one dose and focus) rather than optimizing dimensional control over the entire process window (i.e., a large range of dose and focus).

Bearing in mind the problems and deficiencies of the prior art, it is therefore an object of the present invention to provide an improved method to implement model-based optical proximity correction to circuit patterns on photolithography masks.

It is another object of the present invention to provide a proximity correction technique that improves circuit performance or yield by increasing the process window over which acceptable line width tolerances can be maintained.

A further object of the invention is to provide a proximity correction technique that optimizes overlap between achievable dimensional bounds and acceptable target dimensional bounds.

It is yet another object of the invention to provide a proximity correction technique that recognizes the fact that conditions in an IC manufacturing process fluctuate and that chip designs function over a finite range of dimensional variations.

Still other objects and advantages of the invention will in part be obvious and will in part be apparent from the specification.

SUMMARY OF THE INVENTION

The above and other objects and advantages, which will be apparent to one of skill in the art, are achieved in the present invention which is directed to, in a first aspect, a method of creating a pattern for a mask adapted for use in lithographic production of features on a substrate. The method comprises initially providing a mask pattern of a feature to be created on the substrate using the mask. The method then includes establishing target dimensional bounds of the pattern, determining simulated achievable dimensional bounds of the pattern, comparing the target dimensional bounds of the pattern to the simulated achievable dimensional bounds of the pattern, and determining locations where the simulated achievable dimensional bounds of the pattern differ from the target dimensional bounds of the pattern. In its preferred embodiment, the feature is an integrated circuit to be lithographically produced on a semiconductor substrate.

The target dimensional bounds of the pattern may be established by determining maximum variations in pattern edge placement which still provide adequate pattern feature performance, and the simulated achievable dimensional bounds of the pattern may be established by determining optical proximity effects of the feature pattern on the mask during lithographic production. In general, the simulated achievable dimensional bounds of the pattern may be established by determining lithographic process variations during lithographic production, for example, by determining variations in lithographic dosage through the mask during lithographic production, by determining variations in lithographic focus through the mask during lithographic production, or by determining variations in etching during lithographic production.

The method preferably further includes modifying lithographic process conditions to reduce the locations where the simulated achievable dimensional bounds of the pattern exceed the target dimensional bounds of the pattern. Lithographic process conditions may be reviewed to ensure that widths of the simulated achievable dimensional bounds are narrower than widths of target dimensional bounds for corresponding portions of the feature pattern. The mask feature pattern may be modified to reduce the locations where the simulated achievable dimensional bounds of the pattern exceed the target dimensional bounds of the pattern. More preferably, the mask feature pattern is modified to ensure that the simulated achievable dimensional bounds are within the target dimensional bounds for the feature pattern.

The target dimensional bounds may be determined from theoretical design rules, or from empirical experimental data. The simulated achievable dimensional bounds may be determined from first principle modeling, or from empirical measurements. The target dimensional bounds and simulated achievable dimensional bounds may be represented by a band showing ranges of feature edges, or by lines showing maximum and minimum feature edges. Determining the locations where the simulated achievable dimensional bounds of the pattern differ from the target dimensional bounds of the pattern may include calculating total area of the simulated achievable dimensional bounds outside of the acceptable target dimensional bounds. Where the target dimensional bounds and simulated achievable dimensional bounds are represented by pixels, calculating total area of the simulated achievable dimensional bounds outside of the acceptable target dimensional bounds may be accomplished by determining the sum of all pixels outside of the acceptable target dimensional bounds.

In another aspect, the present invention provides a method of creating a pattern for a mask adapted for use in lithographic production of integrated circuits on a semiconductor substrate, wherein the method comprises providing a mask pattern of a feature to be created on the semiconductor substrate using the mask, and modifying lithography process exposure dose and focus conditions and/or the mask pattern to maximize the usable range of exposure dose and focus conditions in the lithographic production.

In a further aspect, the present invention provides a method of creating a pattern for a mask adapted for use in lithographic production of integrated circuits on a semiconductor substrate, wherein the method comprises providing a mask pattern of a feature to be created on the semiconductor substrate using the mask, establishing target dimensional bounds of the pattern, and modifying the mask pattern such that the resulting image of the mask pattern created on the semiconductor substrate falls within the target dimensional bounds of the pattern.

Yet another aspect of the present invention provides a method of creating a pattern for a mask adapted for use in lithographic production of integrated circuits on a semiconductor substrate, wherein the method comprises providing a mask pattern of a feature to be created on the semiconductor substrate using the mask, determining simulated achievable dimensional bounds of the pattern, and modifying the mask pattern such that the resulting image of the mask pattern created on the semiconductor substrate falls within the simulated achievable dimensional bounds of the pattern.

A related aspect of the present invention provides a computer program product for creating a pattern for a mask adapted for use in lithographic production of integrated circuits on a semiconductor substrate, the mask pattern being of a feature to be created on the substrate using the mask. The computer program product has computer readable program code means for establishing target dimensional bounds of the pattern, computer readable program code means for; determining simulated achievable dimensional bounds of the pattern, comparing the target dimensional bounds of the pattern to the simulated achievable dimensional bounds of the pattern, and computer readable program code means for determining locations where the simulated achievable dimensional bounds of the pattern differ from the target dimensional bounds of the pattern.

Another related aspect of the present invention provides a program storage device readable by a machine, tangibly embodying a program of instructions executable by the machine to perform method steps for creating a pattern for a mask adapted for use in lithographic production of integrated circuits on a semiconductor substrate, the mask pattern being of a feature to be created on the substrate using the mask. The method steps comprise establishing target dimensional bounds of the pattern, determining simulated achievable dimensional bounds of the pattern, comparing the target dimensional bounds of the pattern to the simulated achievable dimensional bounds of the pattern, and determining locations where the simulated achievable dimensional bounds of the pattern differ from the target dimensional bounds of the pattern.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIGS. 1a–1f are plan views of sequential iterations of mask images and simulated wafer images, taking optical proximity effects into account, as produced by a typical prior art OPC tool.

DESCRIPTION OF THE PREFERRED EMBODIMENT(S)

Figure 2:
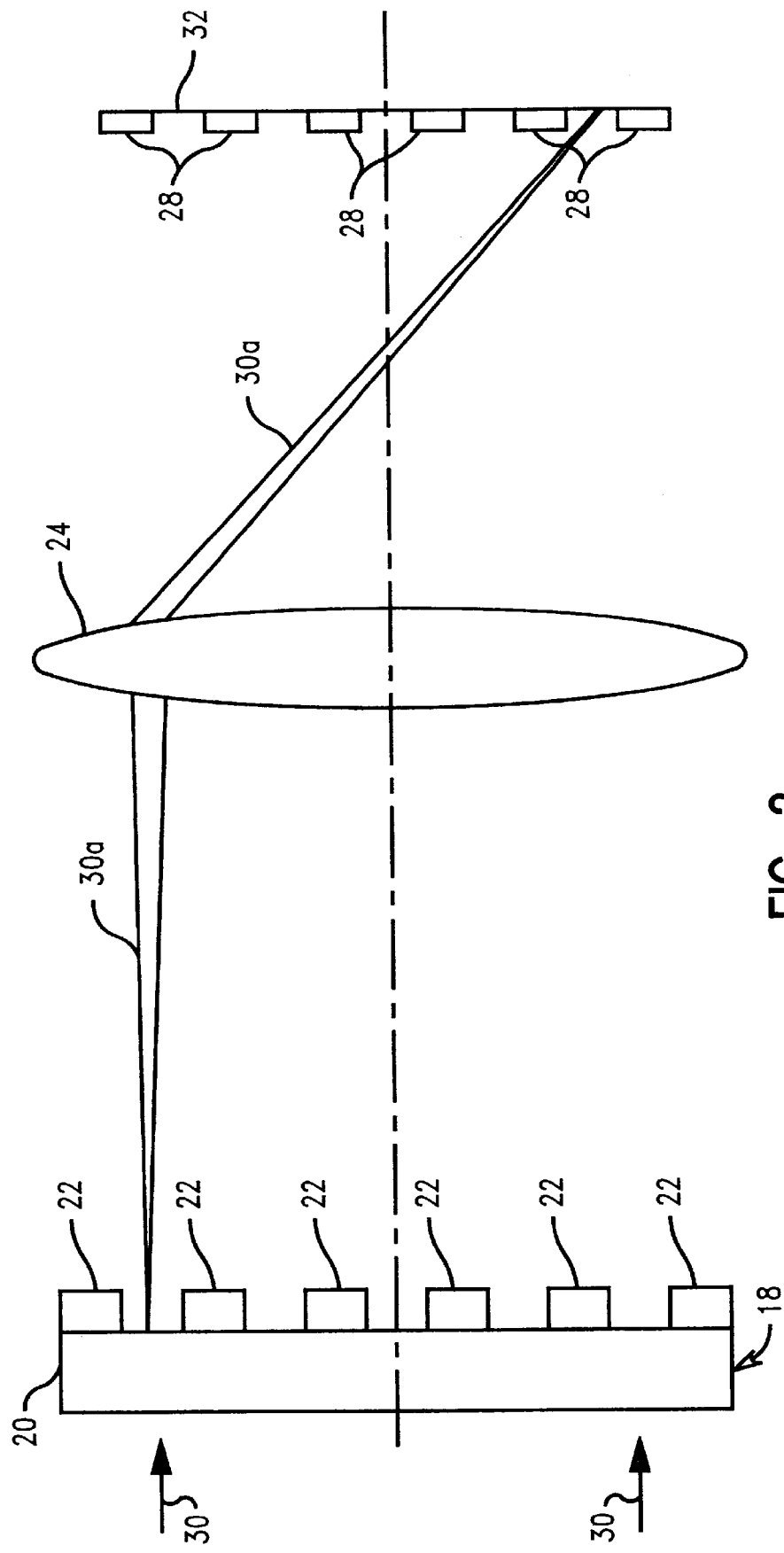
FIG. 2 is a side view of part of a lithographic system used to create a circuit pattern image during lithography.

In describing the preferred embodiment of the present invention, reference will be made herein to FIGS. 1–7 of the drawings in which like numerals refer to like features of the invention. Features of the invention are not necessarily shown to scale in the drawings.

The applicants have determined at least two essential problems with commonly implemented model-based OPC tools. The first problem is that the contours of the simulated pattern on which the iterative correction is based are calculated at a single exposure condition, i.e. the modeled image used for OPC represents a snapshot of one possible image which may be obtained for a given process within acceptable values of process fluctuation. In accounting for the fact that the patterning process has certain fluctuations associated with it, there may be built a model based on the average of models calculated for various dose and focus conditions. However, regardless of what technique is used, in the end, the process is described as a single contour and all information of known and acceptable spread in the actual image edge placement over realistic process windows is lost. The term 'process window' is used herein to refer to the range of exposure dose and defocus as well as other sources of linewidth variation, such as lens aberrations and mask dimensional errors, over which an acceptable (e.g., 10%) linewidth control can be maintained in lithographic processing of the IC.

The second problem is that the final measure for the success of the iterative correction is a comparison of the simulated image to the original mask layout. While it is true that, to a first approximation, the task of lithography is to replicate the mask layout, there are well known and acceptable offsets between the layout and the final wafer image, e.g. corner rounding and line end shortening. Furthermore, the specifications put on the circuit design assume a certain amount of fluctuation in the placement of all edges. None of this information can be communicated in model-based OPC tools that optimize against the original layout. Even pre-distorting the original layout cannot capture allowable edge placement tolerances in the optimization. Accordingly, the present invention provides a new and improved method to implement model-based optical proximity correction based on the principle of improving circuit performance and effective process window. The present invention utilizes otherwise standard OPC to manipulate lithography mask patterns to compensate for a variety of patterning errors in addition to just optical effects.

An example of a lithography process using a mask made in accordance with the present invention is shown in FIG. 2. Radiation comprising energy beam 30 passes through a portion of mask 18 comprising a substrate layer 20 sufficiently transparent to the radiation on which are deposited opaque segments 22 conforming to the circuit pattern image to be projected. The beam 30 portion that passes through the mask 18 between opaque segments 22 is illustrated by beam 30a. Beam 30a is focused by lens system 24 onto the surface 32 of a semiconductor wafer having conventional resist materials sensitive to the radiation. Radiation blocked by, mask portions 22 does not transfer to the resist layer on surface 32. Thus, a contrasting latent image 28 is formed, on wafer resist surface 32 which conforms to the pattern of opaque layer 22 on the mask, except for optical proximity effects. The resist is then developed, and the pattern created by the latent image is used to produce a desired circuit or portion thereof on the wafer.

Figure 3:
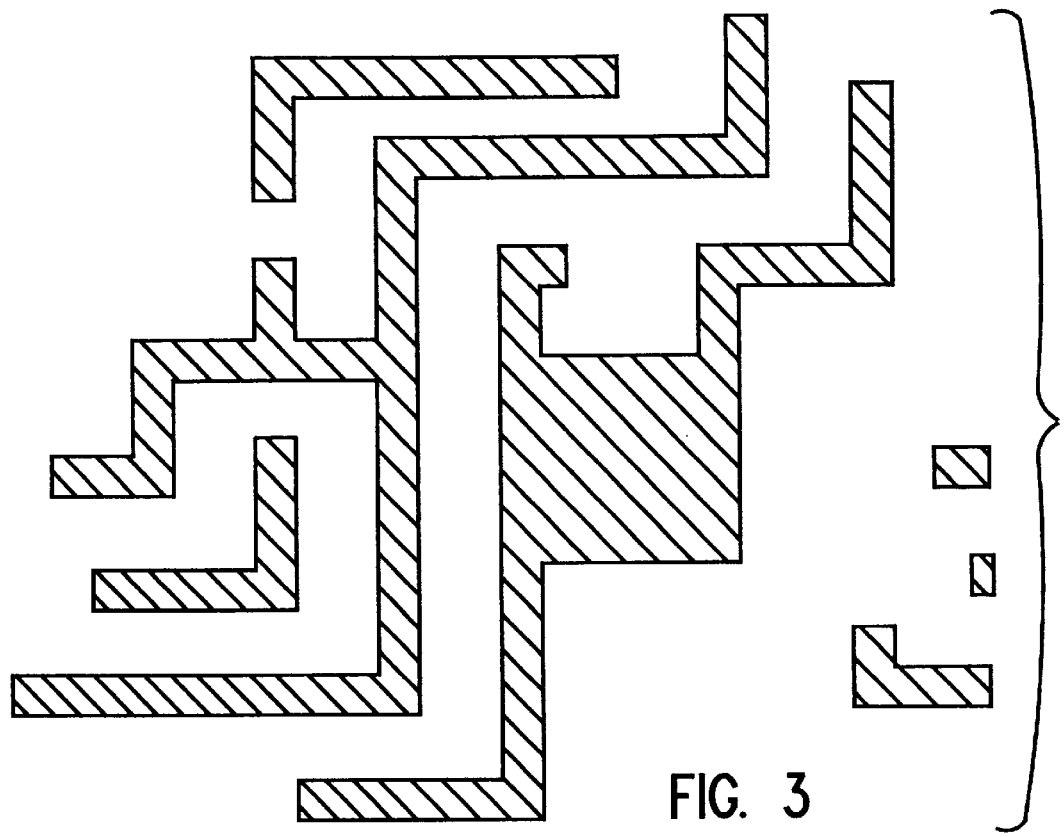
FIG. 3 is a plan view of a sample circuit pattern to be reproduced on a wafer substrate by photolithography.
Figure 4:
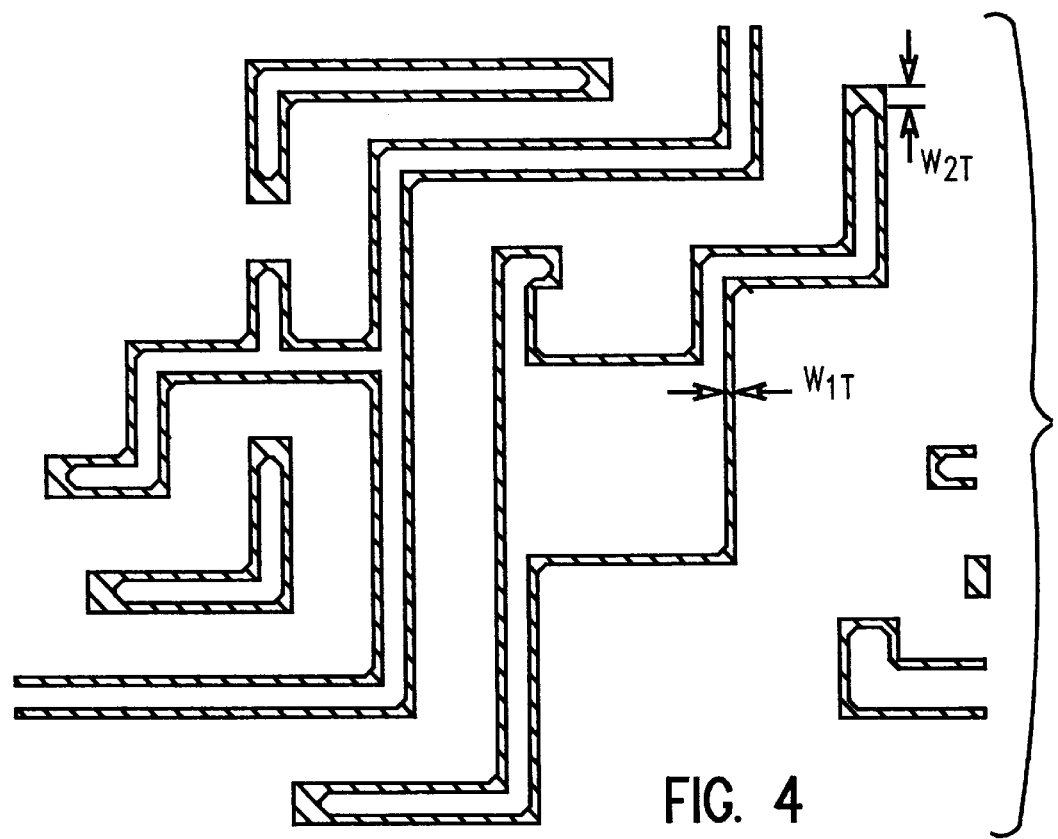
FIG. 4 is a plan view of the circuit performance target dimensional bounds of the circuit pattern of FIG. 3.

FIG. 3 shows a sample circuit pattern to be reproduced on a wafer substrate by photolithography. Given the circuit layout of FIG. 3, the first step in the OPC method of the present invention is to establish target dimensional bounds over which proper circuit performance is guaranteed by the design assumptions and the process error budget. The target dimensional bounds establish how much the particular circuit pattern may vary in size and still provide adequate electrical performance, and may be determined by conventional methods without undue experimentation. The target dimensional bounds are around each feature segment and specify the acceptable range of edge displacement for each feature segment. FIG. 4 shows such target dimensional bounds for the circuit pattern of FIG. 3, and include line width and corner rounding, as well as other, variations. Target dimensional bounds may be derived from design rules of the IC or empirically by experimental data for the circuits on the IC. For example, the target dimensional bound of a line segment is indicated as $W_{1T}$, and the target dimensional bound for a line end is indicated as $W_{2T}$. These target dimensional bounds depend on intra-feature characteristics, for example, poly over diffusion equals a gate, contact over/under metal equals a critical line end, and the like. For example, acceptable variation in metal layer line end may be determined by location of contacts on adjacent lithographic layers to determine maximum variations before performance is impacted, and other allowable maximum pattern feature variations may be likewise determined for each circuit pattern on each layer.

Figure 5:
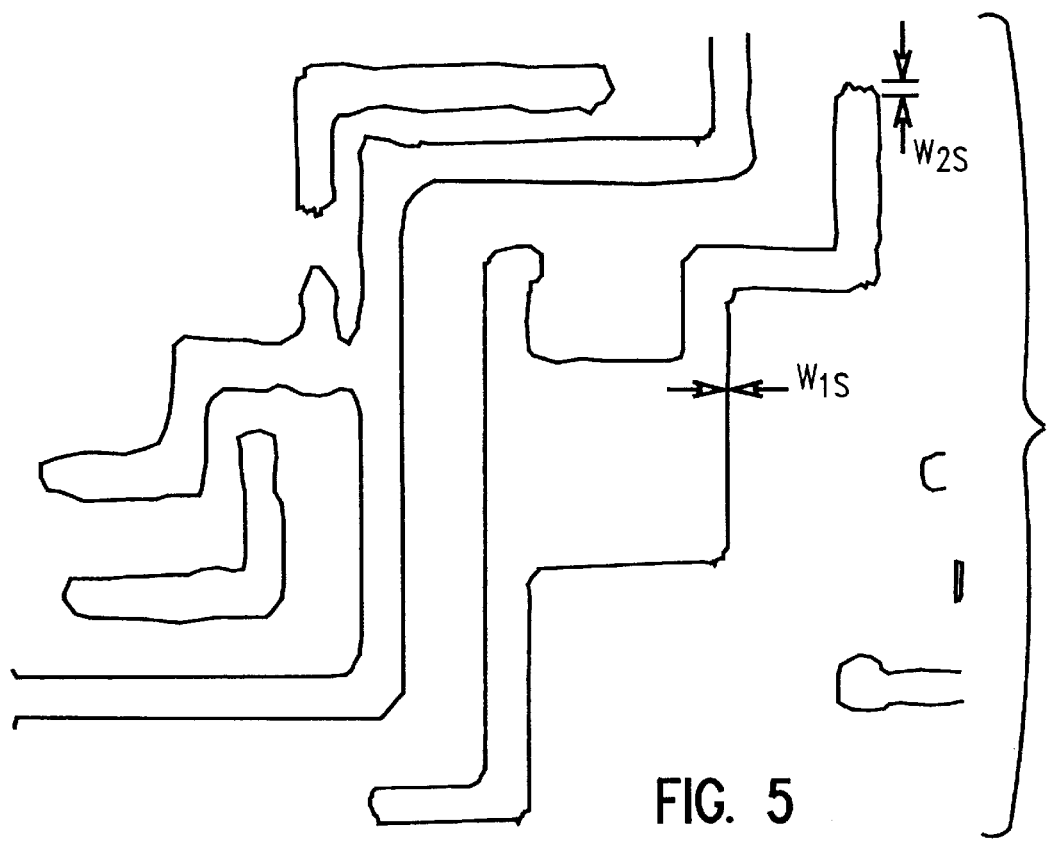
FIG. 5 is a plan view of the simulated achievable dimensional bounds of the circuit pattern of FIG. 3 given lithographic process variations.

The second aspect of the present invention is the generation of simulated achievable dimensional bounds that outline and establish the spread of the simulated projected image over the required process window, based on assumed process fluctuations and variations. As illustrated in FIG. 5, the simulated dimensional bounds indicate the edges of the band within which any edge of the input pattern is expected to be imaged over a given range of lithographic process conditions, for example, extremes in dose and focus variation, resist effects, etch variation, as well as other desired modeled process fluctuations. The simulated dimensional bounds may likewise be determined by conventional techniques without undue experimentation. Simulated achievable dimensional bounds may be determined through simulation, by first principle modeling, or through empirical measurements, or some combination thereof (i.e., empirically anchored simulation). As referenced herein, empirical measurement may be by measurement of wafer data, or by measurement of the aerial image of the pattern projected by the mask. FIG. 5 shows the simulated dimensional bounds for the band and feature segments previously identified in FIG. 4 as $W_{1S}$ and $W_{2S}$, respectively.

Both the target dimensional bounds and the simulated achievable bounds may be calculated and represented as bands or ranges, as shown in FIGS. 4 and 5, or as maximum-minimum contours, i.e., lines showing only the smallest feature outline and the largest feature outline.

Figure 6:
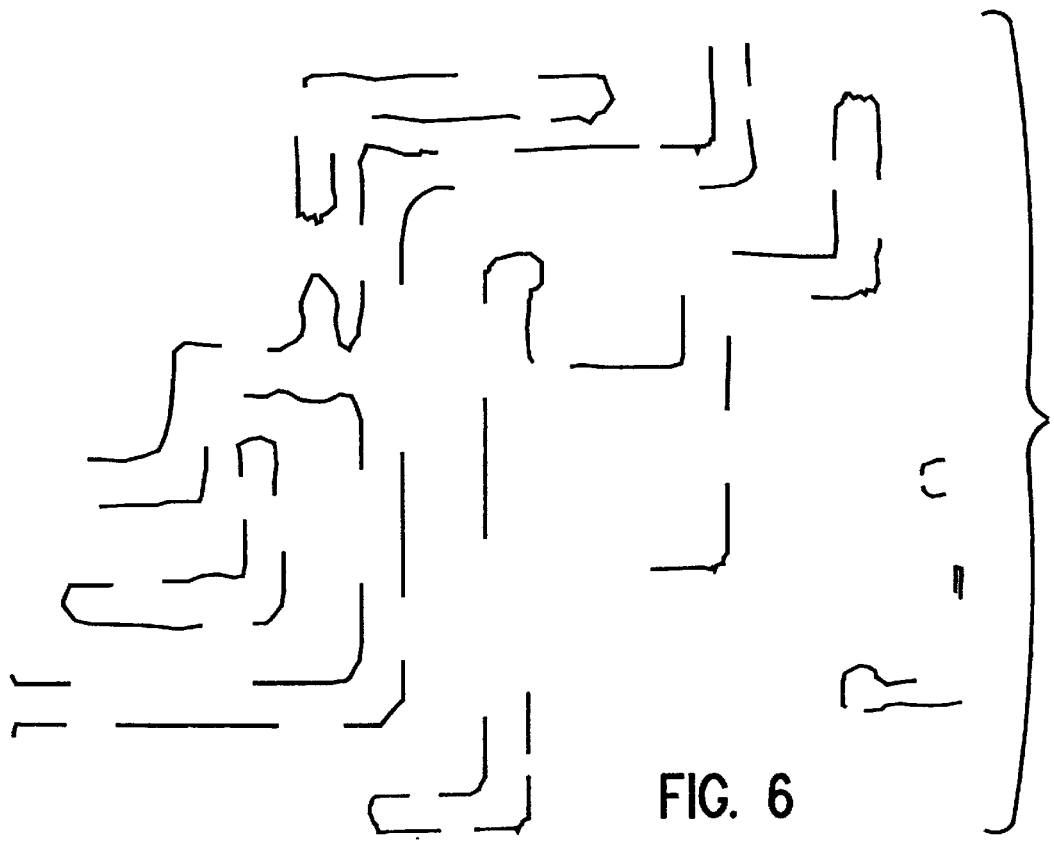
FIG. 6 is a plan view of the points where the simulated achievable dimensional bounds of FIG. 5 fall outside of the target dimensional bounds of FIG. 4.
Figure 7:
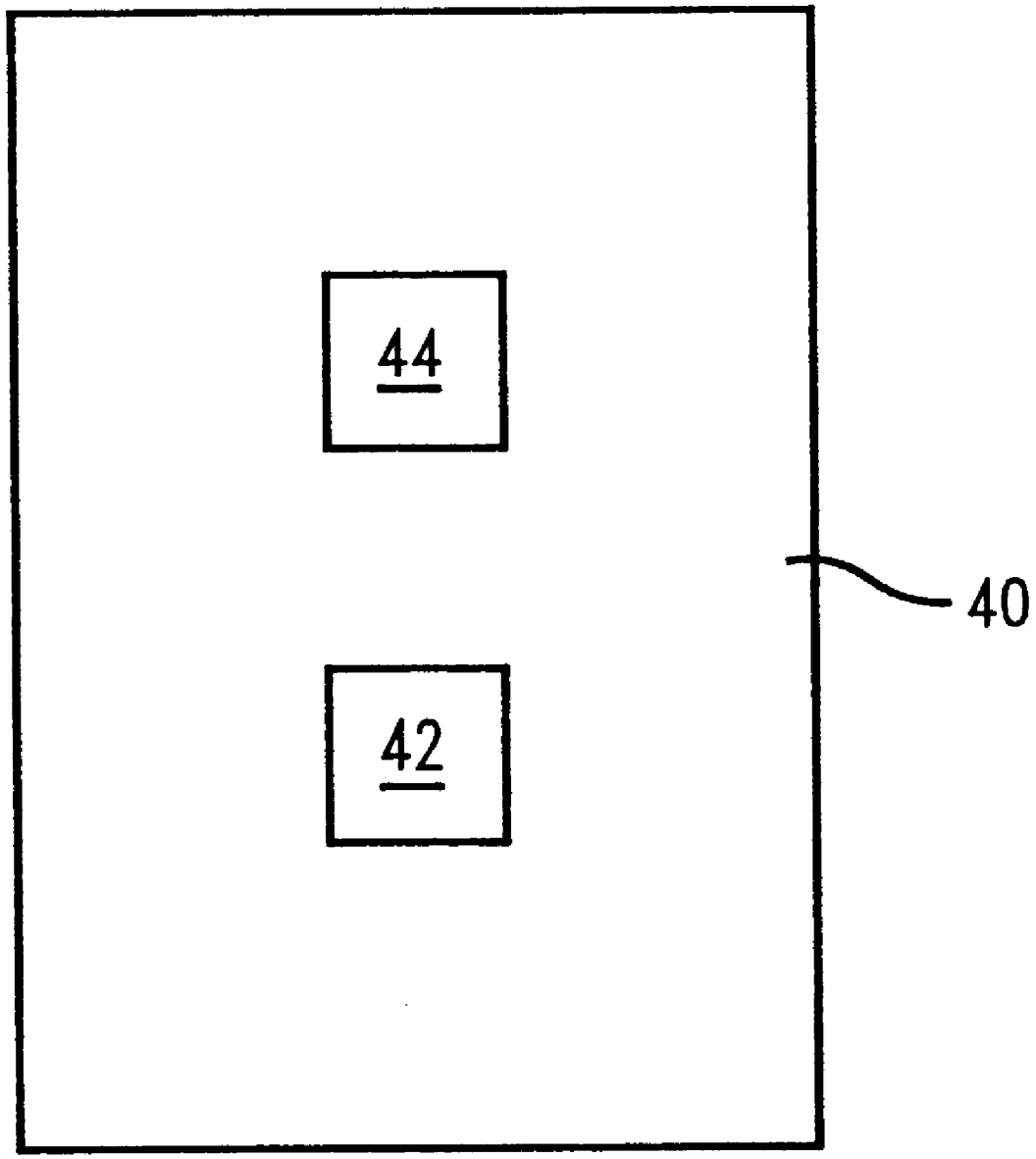
FIG. 7 is a schematic of a computer for running a computer program embodying the method of the present invention.

In accordance with the present invention, proper circuit operation over a given process window is deemed guaranteed if the entire width of all simulated achievable dimensional bounds can be contained within the established target dimensional bounds. The present method compares the target dimensional bounds of the pattern to the simulated achievable dimensional bounds of the pattern, and determines locations where the simulated achievable dimensional bounds of the pattern exceed the target dimensional bounds of the pattern. In the examples previously given, the target dimensions and locations of line and feature segments $W_{1T}$ and $W_{2T}$ (FIG. 4) would be respectively compared to the simulated dimensions and locations of line and feature segments $W_{1S}$ and $W_{2S}$ (FIG. 5) to determine where the latter exceeds the former in size. FIG. 6 illustrates points, also known as pixels, where the simulated achievable dimensional bounds of FIG. 5 fall outside of the established target dimensional bounds of FIG. 4. These are termed 'bad pixels', and require enhancement techniques to improve circuit performance. The method of the present invention preferably calculates the total area of the simulated achievable dimensional bounds outside of the acceptable target dimensional bounds, e.g., by adding up the sum of all bad pixels. The concept of dimensional bounds as used in the present invention may be used to a) characterize a lithographic process by using the bad pixels a metric, b) optimize a process by reducing or eliminating the bad pixels shown in FIG. 6, or c) do OPC. In the case of process optimization, the calculation of bad pixels may be linked to a program that simulates a variety of process options, e.g., lithographic illumination, mask type resist characteristics, global mask bias, and the like.

Given the target dimensional bounds and the simulated achievable dimensional bounds, the OPC correction method of the present invention preferably involves a two step process. It is important to note that OPC by itself does not improve lithographic process window, i.e., manipulating the mask layout does not significantly reduce the pattern's sensitivity to dose, focus, and other process fluctuations. However, the first task in the present method is to ensure that the simulated achievable dimensional bounds are always narrower than the target dimensional bounds. That is, independent of the placement of the simulated achievable dimensional bounds, if the spread in edge placement in the simulated image over a given process window is wider than the allowable spread, layout manipulations will fail to converge on a good overlap of the simulated achievable dimensional bound to the target dimensional bound. This is accomplished by manipulating the process conditions or lightening the process conditions or lightening the process fluctuations using techniques well known to those skilled in the art. This may involve using a higher resolution lithographic process or a better resist system. The simulated achievable dimensional bounds provide valuable graphical feedback on the success of this optimization operation.

The second preferred step in the present method is to iteratively manipulate and modify the mask layout data to ensure that all simulated achievable dimensional bounds can be contained within the established target dimensional bounds. One way of implementing this optimization iteration is by directly subtracting shapes formed by expanding regions where the simulated achievable dimensional bound falls outside the target dimensional bound from the original mask layout, and adding shapes formed by shrinking regions where the simulated achievable dimensional bound falls inside the target dimensional bound. Other optimization techniques may be employed. Once the target dimensional bounds are defined based on the original layout and various design rules, the layout has essentially served its purpose. That is, the optimum mask pattern derived by this optimization technique may resemble the original layout to varying degrees, but there is no patterning requirement restricting the abstractness of the mask pattern. Manufacturability considerations will typically constrain the nature of the mask pattern. In the case where the simulated achievable bounds are still larger than the target bounds, the present invention minimizes the number and amount of bad pixels.

While the process of optimization and OPC task are described herein as two sequential operations, the preferred embodiment of the present method employs the combination of tightly coupled layout and process manipulations.

The method of the present invention may be embodied as a computer program product stored on a program storage device. This program storage device may be devised, made and used as a component of a machine utilizing optics, magnetic properties and/or electronics to perform the method steps of the present invention. Program storage devices include, but are not limited to, magnetic disks or diskettes, magnetic tapes, optical disks, Read Only Memory (ROM), floppy disks, semiconductor chips and the like. A computer readable program code means in known source code may be employed to convert the methods described below for use on a computer. The computer program or software incorporating the process steps and instructions described further below may be stored in any conventional computer, for example, that shown in FIG. 7. Computer 40 incorporates a program storage device 42 and a microprocessor 44. Installed on the program storage device 42 is the program code incorporating the method of the present invention, as well as any database information for the mask pattern of a feature to be created on the semiconductor substrate and the lithographic process window variations.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method of creating a pattern for a mask adapted for use in lithographic production of features on a substrate, the method comprising:

providing a mask pattern of a feature to be created on the substrate using the mask;

establishing target dimensional bounds of the pattern;

determining simulated achievable dimensional bounds of the pattern;

comparing the target dimensional bounds of the pattern to the simulated achievable dimensional bounds of the pattern; and determining locations where the simulated achievable dimensional bounds of the pattern differ from the target dimensional bounds of the pattern.

2. The method of claim 1, wherein the feature is an integrated circuit on a semiconductor substrate.

3. The method of claim 1, wherein target dimensional bounds of the pattern are established by determining maximum variations in pattern edge placement which still provide adequate pattern feature performance.

4. The method of claim 1, wherein simulated achievable dimensional bounds of the pattern are established by determining optical proximity effects of the feature pattern on the mask during lithographic production.

5. The method of claim 1, wherein simulated achievable dimensional bounds of the pattern are established by determining lithographic process variations during lithographic production.

6. The method of claim 5, wherein simulated achievable dimensional bounds of the pattern are established by determining variations in lithographic dosage through the mask during lithographic production.

7. The method of claim 5, wherein simulated achievable dimensional bounds of the pattern are established by determining variations in lithographic focus through the mask during lithographic production.

8. The method of claim 5, wherein simulated achievable dimensional bounds of the pattern are established by determining variations in etching during lithographic production.

9. The method of claim 5, further including reviewing lithographic process conditions to ensure that widths of the simulated achievable dimensional bounds are narrower than widths of target dimensional bounds for corresponding portions of the feature pattern.

10. The method of claim 1, further including modifying lithographic process conditions to reduce the locations where the simulated achievable dimensional bounds of the pattern exceed the target dimensional bounds of the pattern.

11. The method of claim 1, further including modifying the mask feature pattern to reduce the locations where the simulated achievable dimensional bounds of the pattern exceed the target dimensional bounds of the pattern.

12. The method of claim 1, further including modifying the mask feature pattern to ensure that the simulated achievable dimensional bounds are within the target dimensional bounds for the feature pattern.

13. The method of claim 1, wherein the target dimensional bounds are determined from theoretical design rules.

14. The method of claim 1, wherein the target dimensional bounds are determined from empirical experimental data.

15. The method of claim 1, wherein the simulated achievable dimensional bounds are determined from first principle modeling.

16. The method of claim 1, wherein the simulated achievable dimensional bounds are determined from empirical measurements.

17. The method of claim 1, wherein the target dimensional bounds and simulated achievable dimensional bounds are represented by a band showing ranges of feature edges.

18. The method of claim 1, wherein the target dimensional bounds and simulated achievable dimensional bounds are represented by lines showing maximum and minimum feature edges.

19. The method of claim 1, wherein determining the locations where the simulated achievable dimensional bounds of the pattern differ from the target dimensional bounds of the pattern includes calculating total area of the simulated achievable dimensional bounds outside of acceptable target dimensional bounds.

20. The method of claim 19, wherein the target dimensional bounds and simulated achievable dimensional bounds are represented by pixels, and wherein calculating total area of the simulated achievable dimensional bounds outside of the acceptable target dimensional bounds is performed by determining a sum of all pixels outside of the acceptable target dimensional bounds.

21. A method of creating a pattern for a mask adapted for use in lithographic production of integrated circuits on a semiconductor substrate, the method comprising:

providing a mask pattern of a feature to be created on the semiconductor substrate using the mask; and modifying lithography process exposure dose and focus conditions and/or the mask pattern to maximize a usable range of exposure dose and focus conditions in the lithographic production.

22. A method of creating a pattern for a mask adapted for use in lithographic production of integrated circuits on a semiconductor substrate, the method comprising:

providing a mask pattern of a feature to be created on the semiconductor substrate using the mask;

determining simulated achievable dimensional bounds of the pattern; and modifying the mask pattern such that the resulting image of the mask pattern created on the semiconductor substrate falls within the simulated achievable dimensional bounds of the pattern.

23. A computer program product for creating a pattern for a mask adapted for use in lithographic production of integrated circuits on a semiconductor substrate, the mask pattern being of a feature to be created on the substrate using the mask, said computer program product having:

computer readable program code means for establishing target dimensional bounds of the pattern;

computer readable program code means for determining simulated achievable dimensional bounds of the pattern;

computer readable program code means for comparing the target dimensional bounds of the pattern to the simulated achievable dimensional bounds of the pattern; and computer readable program code means for determining locations where the simulated achievable dimensional bounds of the pattern differ from the target dimensional bounds of the pattern.

24. A program storage device readable by a machine, tangibly embodying a program of instructions executable by the machine to perform method steps for creating a pattern for a mask adapted for use in lithographic production of integrated circuits on a semiconductor substrate, the mask pattern being of a feature to be created on the substrate using the mask, said method steps comprising:

establishing target dimensional bounds of the pattern;

determining simulated achievable dimensional bounds of the pattern;

comparing the target dimensional bounds of the pattern to the simulated achievable dimensional bounds of the pattern; and determining locations where the simulated achievable dimensional bounds of the pattern differ from the target dimensional bounds of the pattern.

* * * * *